United States Patent [19]

Meinzer

[11] Patent Number: 5,379,315
[45] Date of Patent: Jan. 3, 1995

[54] SEMICONDUCTOR LASER PUMPED MULTIPLE MOLECULAR GAS LASERS

[75] Inventor: Richard A. Meinzer, Glastonbury

[73] Assignee: United Technologies Corporation, Hartford, Conn.

[21] Appl. No.: 980,020

[22] Filed: Nov. 23, 1992

[51] Int. Cl.$^6$ ............................ H01S 3/22; H01S 3/223
[52] U.S. Cl. .......................................... 372/55; 372/101
[58] Field of Search ............................ 372/55, 71, 101

[56] References Cited

U.S. PATENT DOCUMENTS

| | | | |
|---|---|---|---|
| 4,126,832 | 11/1978 | Schlossberg et al. | 372/55 |
| 4,177,435 | 12/1979 | Brown | 372/55 |
| 4,276,517 | 6/1981 | McAllister | 372/71 |
| 4,318,060 | 3/1982 | Davis | 372/55 |
| 4,942,586 | 7/1990 | Lai | 372/101 |
| 5,202,893 | 4/1993 | Kubota et al. | 372/101 |

OTHER PUBLICATIONS

Proposal for the Development of a Diode Pumped Sealed Gas Laser Tube (P91-259); Richard A. Meinzer, Jul. 8, 1991.

Primary Examiner—Rodney B. Bovernick
Assistant Examiner—Robert E. Wise
Attorney, Agent, or Firm—Gerald L. DePardo

[57] ABSTRACT

A gas laser cavity 44 comprises a first (pumped) molecular gas 52 and a second (lasing) molecular gas 52, such as Hydrogen Halides. The first gas is pumped by a plurality of semiconductor lasers 20 which provide light carried along optical fibers 26 that provide divergent light 32 to a collimating lens 34 that provides collimated light 36 to a focussing lens 38 that provides pumping light 40 which propagates within the gas laser cavity 44 in a zig-zag pattern, thereby providing a homogeneously excited medium and providing sufficient pathlength to give adequate absorption of the pump light. The pump light 40 has a wavelength within the absorption frequency band of the first gas 52 and a wavelength capable of pumping the first gas molecules from the ground state to an excited state. The energy of the first gas transfers to the second gas and lasing occurs in the second gas. Thus, the pumped gas may be selected based on absorption of the pumping light and the lasing gas selected based on the desired output lasing wavelength.

22 Claims, 6 Drawing Sheets

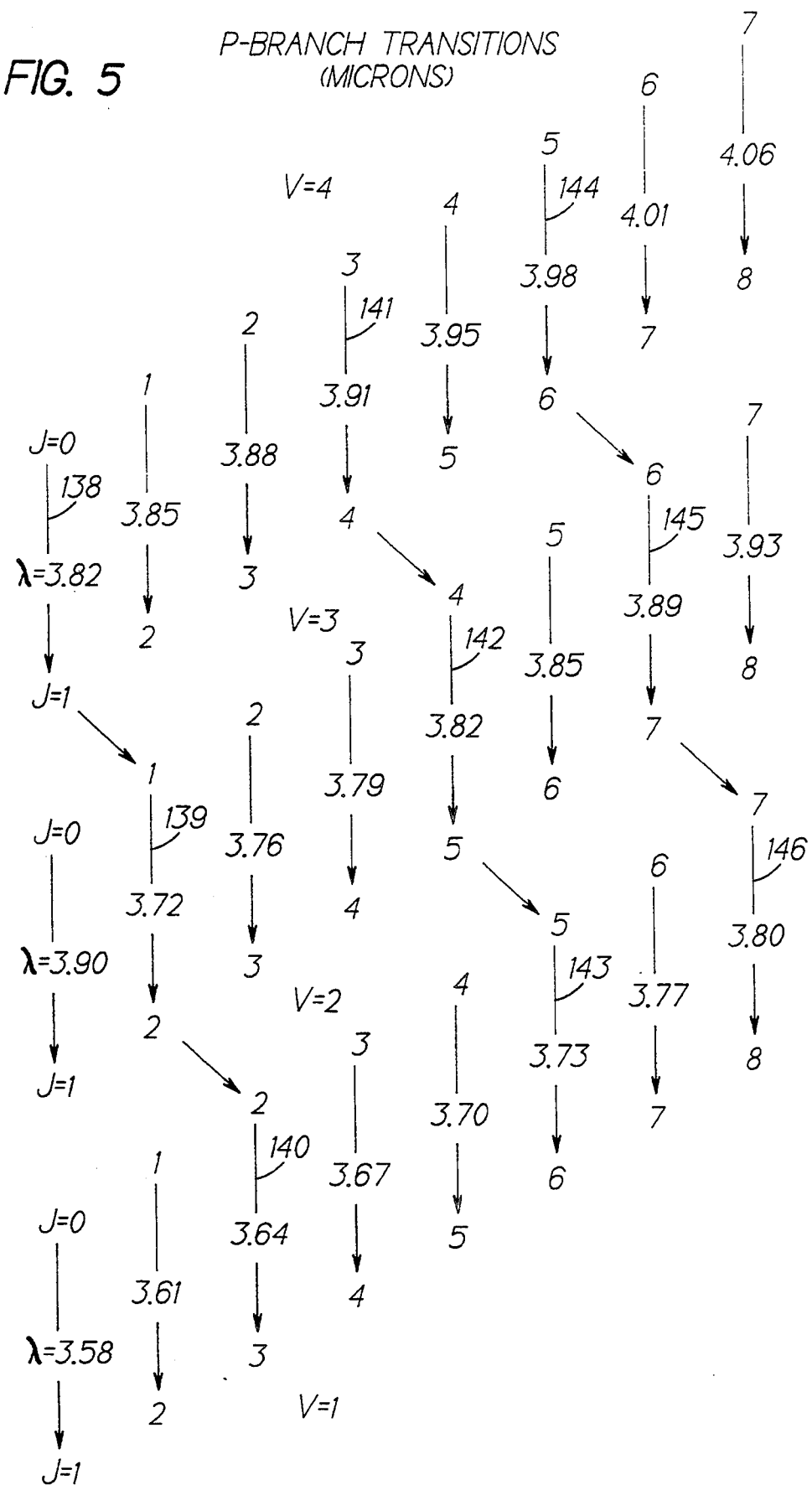
FIG. 5 P-BRANCH TRANSITIONS (MICRONS)

SEMICONDUCTOR LASER PUMPED MULTIPLE MOLECULAR GAS LASERS

CROSS REFERENCE TO RELATED APPLICATIONS

Copending U.S. patent application Ser. No. 980,016, filed contemporaneously herewith, contains subject matter related to that disclosed herein, and is herein incorporated by reference.

TECHNICAL FIELD

This invention relates to gas lasers, and more particularly, to pumping of gas lasers with a semiconductor laser.

BACKGROUND ART

It is known that "pumping" is a process by which the energy of molecules in a gas medium is raised to a vibrational and rotational energy level to allow lasing to occur. The total number of excited molecules per $cm^3$ above a known threshold for a given medium creates a "population inversion" which allows the excited molecules to lase, i.e., emit photons, when excited molecules transition from one excited (pumped) energy level to a lower level.

It is also known that there are numerous ways to pump molecular gas lasers. For example, a Carbon Dioxide ($CO_2$) gas laser may be pumped electrically by injecting electrons into the $CO_2$ by a plasma and the collisions between the electrons and molecules excite the gas molecules. This technique allows the same $CO_2$ molecules to be re-used each time the Easer is pumped. Helium-Neon (HeNe) lasers are also pumped in this fashion. However, electrically pumped $CO_2$-lasers typically have a low efficiency, e.g., 5-10%, defined as output optical power at the desired wavelength divided by total electric input power. Also, for high power $CO_2$ lasers, the gas is typically pumped through the cavity in a "closed cycle" to dissipate heat. This is also called a "flowing" laser system.

Some gas lasers, such as Hydrogen Fluoride (HF) and Deuterium Fluoride (DF), may not be pumped electrically because direct collisions with electrons will not excite the gas molecules to allow lasing to occur. Instead, pumping is performed chemically by reacting two or more atoms/molecules together. For example, for an HF laser, Fluorine (F) atoms are reacted with $H_2$ to create a vibrationally excited HF. With cw pumping, the reactants are consumed in the reaction, thereby requiring a fresh supply of reactants to re-excite (or re-pump) the system. Thus, an HF laser is a "consumable" or "open cycle" laser system that does not allow reuse of the same molecules. Also, consumable lasers are expensive to run because chemicals must be continuously provided and pumped away. Further, both consumable and flowing systems take up more physical space because they require pump hardware along with nozzles, valves, and other plumbing hardware.

It is also known that gas lasers, such as HF, can sustain high laser output power when they are chemically pumped, and have a highly coherent output beam.

Alternatively, as is known, a gas laser may be thermally pumped by heating the gas to a predetermined temperature, e.g., a gas dynamic $CO_2$ laser. However, this process also has a low efficiency and requires external heating hardware or a chemical reaction to generate the required gas temperature.

Furthermore, when a gas laser is pumped by heat or electrons, etc., all energy levels are pumped. Consequently, all the excitable levels within the medium are pumped and lasing can occur from all potential lasing levels. The energy contained within the nonlasing levels is released as waste heat which must be removed by rapid flowing of the gas. For HF or DF gases, to permit amplification of a single or small number of output lasing wavelengths (i.e., a narrow wavelength spread), a laser cavity must be designed to reflect (and partially transmit) the desired output lasing wavelengths, and reflect the undesired lasing wavelengths with sufficient reflection loss to prevent light amplification from occurring, e.g., by using a grating for wavelength discrimination. This type of pumping causes inefficiencies because the total energy required to pump the gas to the excited state (i.e., the sum of all the individual pumping energies needed to provide each lasing wavelength) is much greater than the desired optical energy output (i.e., a single or small number of output wavelengths). Thus, the energy expended to pump (excite) the unused lasing transitions is lost.

Therefore, it would be desirable to obtain a gas laser that does not consume gas for lasing, does not require fast flowing of gas for cooling, and does not have the lasing inefficiencies of currently available pumped gas lasers, yet provides the highly coherent output beam quality of gas lasers.

DISCLOSURE OF INVENTION

Objects of the invention include provision of a semiconductor laser pumped gas laser which does not require consumption of gas to create an excited medium for lasing action.

According to the present invention, a plurality of semiconductor lasers, such as laser diodes, provide output light which is incident upon and excites a gas laser comprising a first and a second molecular gas medium; the laser light has a wavelength spread within of the absorption frequency band of the first gas and has a wavelength/energy that is compatible with the first gas energy levels; the energy of the first gas transfers to the second molecular gas, thereby providing lasing at wavelengths associated with the second gas different from that available from the first gas.

According further to the invention, the semiconductor lasers are temperature controlled to tune the laser output wavelength to near the center of the absorption band of the gas laser.

Still further according to the invention, the first gas comprises a hydrogen halide, such as Hydrogen Fluoride (HF). According further to the invention, the first gas lasing medium is combined with an inert gas, such as Argon (Ar) to pressure broaden the absorption frequency band of the first gas. Still further according to the invention, the second gas comprises a hydrogen halide different from the first gas, such as Deuterium Fluoride (DF).

According still further to the invention, optical fibers are used to propagate the semiconductor laser light to the gas laser. In still further accord to the invention, the optical fibers are located along the inside of the gas laser cavity and pump the first gas by an evanescent field emanating from the sides of the fibers, which are selected to optimize the emission of this field.

The present invention represents a significantly improvement over the prior art by providing a non-consumable molecular gas laser having a highly coherent output and being pumped by an efficient semiconductor laser. Also, the invention provides the ability for a molecular gas laser to lase at a small number of wavelengths, thereby allowing tailoring of the lasing process and avoiding the typical losses associated with pumping gas lasers. Further, the invention may be used in any application that requires a highly coherent beam, e.g., laser welding, laser surgery, etc. Also, the invention is more compact and has a faster turn-on time than consumable or pumped gas lasers. Still further, the invention provides a scalable gas laser that may easily be scaled to higher powers by merely adding more laser diodes.

The foregoing and other objects, features and advantages of the present invention will become more apparent in light of the following detailed description of exemplary embodiments thereof as illustrated in the accompanying drawings.

BRIEF DESCRIPTION OF DRAWINGS

FIG. 5 is a diagram of DF P-branch fundamental lasing transitions from $v=4$ to $v=3$, $v=3$ to $v=2$, and $v=2$ to $v=1$ level, and the associated lasing wavelengths, in accordance with the present invention.

BEST MODE FOR CARRYING OUT THE INVENTION

Figure 1:
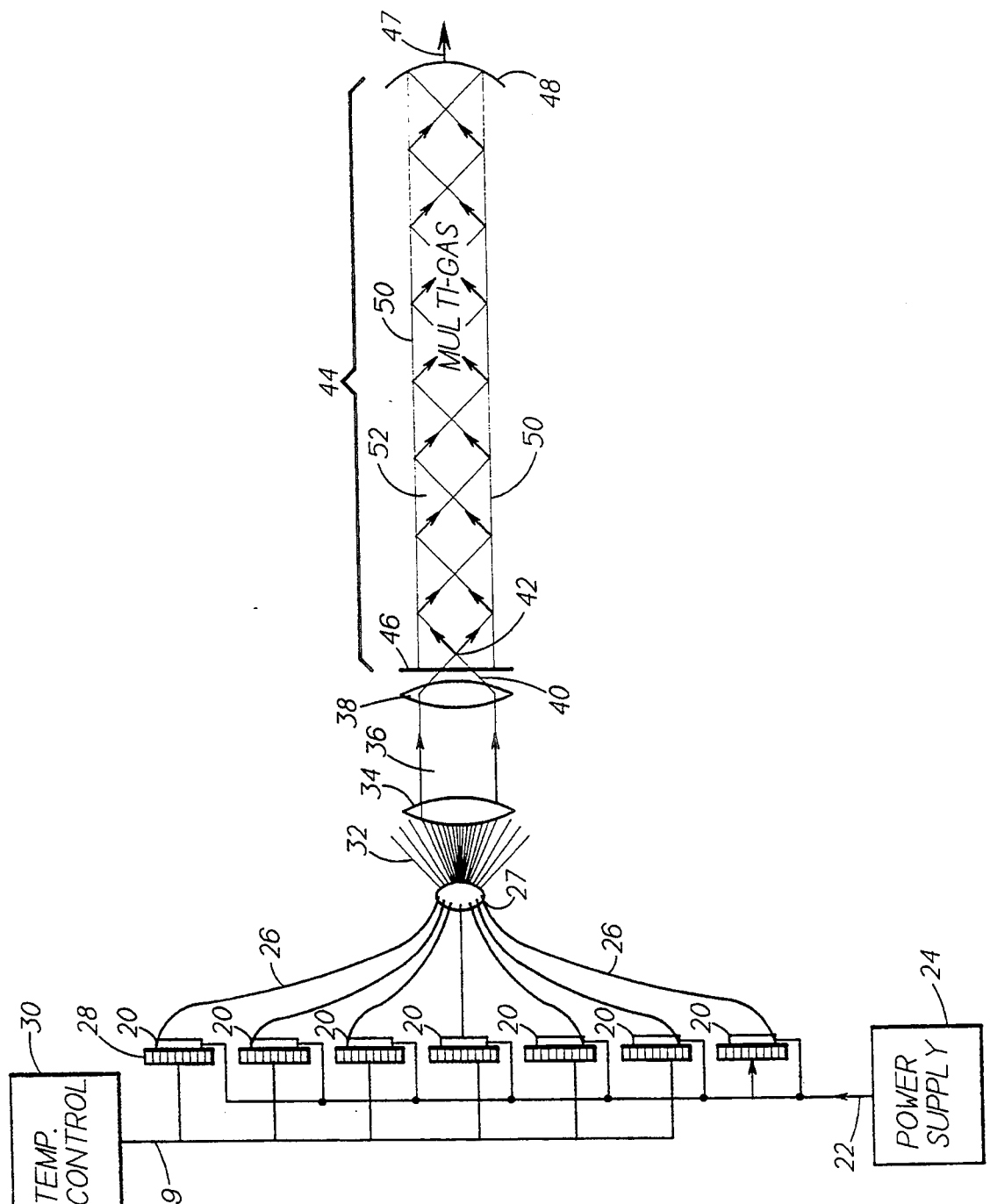
FIG. 1 is a diagram showing a plurality of laser diodes coupled to optical fibers which emit light through optical elements to pump a laser cavity filled with gas, in accordance with the present invention.

Referring now to FIG. 1, a plurality of laser diodes 20, e.g., Spectra Diode Labs SDL-5400, are driven by current signals on lines 22 from a power supply 24 capable of controlling the current to each of the diodes 20, individually. For continuous wave (cw) operation, the current on the line 22 is a direct current or dc and for pulsed laser operation, the current is pulsed at the desired optical pulse rate. Each laser diode 20 is connected to one of a plurality of optical fibers 26, at one end of the fiber. The other end of each fiber 26, is bundled together in a bundle 27. The optical fibers 26 act as a conduit for carrying the light emitted from the laser diodes 20. Also, each laser diode 20 is disposed on a thermoelectric (TE) cooler 28 to adjust the temperature thereof and, thereby adjust the center frequency of the output light therefrom. Each of the TE coolers 28 is driven by signals on lines 29 from a temperature control circuit 30 capable of controlling each of the TE coolers 28, individually. Other laser diodes may be used if desired provided the output wavelength/energy characteristics meet the requirements discussed herein and in the aforementioned copending patent application.

The laser diodes 20, as is known, produce highly divergent light (which is not highly coherent and, thus, does not focus as well as gas lasers). This light is injected into optical fibers 30 by standard techniques, e.g., a microlens, or butting the fiber to the laser diode. The output of the optical fibers 30 is a collection of light 32 from the plurality of laser diodes 20.

The divergent light 32 is passed through a collimating lens 34 which provides an output collimated light 36. The collimated light 36 is passed through a focusing lens 38 which provides a focused beam 40 having a focal point 42 inside a laser cavity 44.

The laser cavity 44 comprises a first mirror 46 being anti-reflective at the wavelength of the laser diode, e.g., 0.9 microns, thereby allowing all the light 40 to enter the cavity 44, and being totally reflective at the wavelength of a desired output beam 47 from the laser, e.g., 1.5 microns. A second mirror 48 is located on the opposite end of the cavity 44 and is about 95% reflective (or 5% transmissive) at the output laser beam 47 wavelength, e.g., 1.5 microns, and totally reflective at the laser diode pumping wavelength, e.g., 0.9 microns.

The side walls of the laser cavity 44 comprise a glass tube 50 having a coating which is highly reflective at all wavelengths, such as gold or a dielectric coating, such that the input pumping wavelength cannot escape from the cavity 44. Thus, the tube 50 behaves like a waveguide. The length of the cavity is approximately twenty centimeters and the diameter of the cavity is about two millimeters. Other lengths and diameters may be used if desired. It should be understood that FIG. 2 is not drawn to scale for illustrative purposes.

The focused light 40 propagates within the laser cavity 44 in a zig-zag pattern, thereby making the total path length of the pumping light much longer than the actual length of the cavity 44 (discussed hereinafter). Also, the zig-zag pattern is used to inject the pumping energy relatively uniformly to provide a substantially homogeneous excited medium.

Inside the cavity 44 is a first (pumped) molecular gas gain medium, such as Hydrogen Fluoride (HF), having characteristics matched to the pumping light, as discussed hereinbefore and in the aforementioned copending application, and a second (lasing) molecular gas, such as DF, for providing the output lasing wavelengths different from that available from the first gas. However, any molecular gases may be used for the first and second gases respectively, provided the energy levels match-up, as discussed hereinafter. For example, any Hydrogen Halide gas may be used for the first gas, e.g., Hydrogen Chloride (HCl), Hydrogen Bromine (HBr), DF, or HF. Also, the pumped gas may be combined with an inert gas, such as Ar, to broaden the absorption frequency band. For the second gas, e.g., any Hydrogen Halide gas or $CO_2$ may be used.

Figure 2:
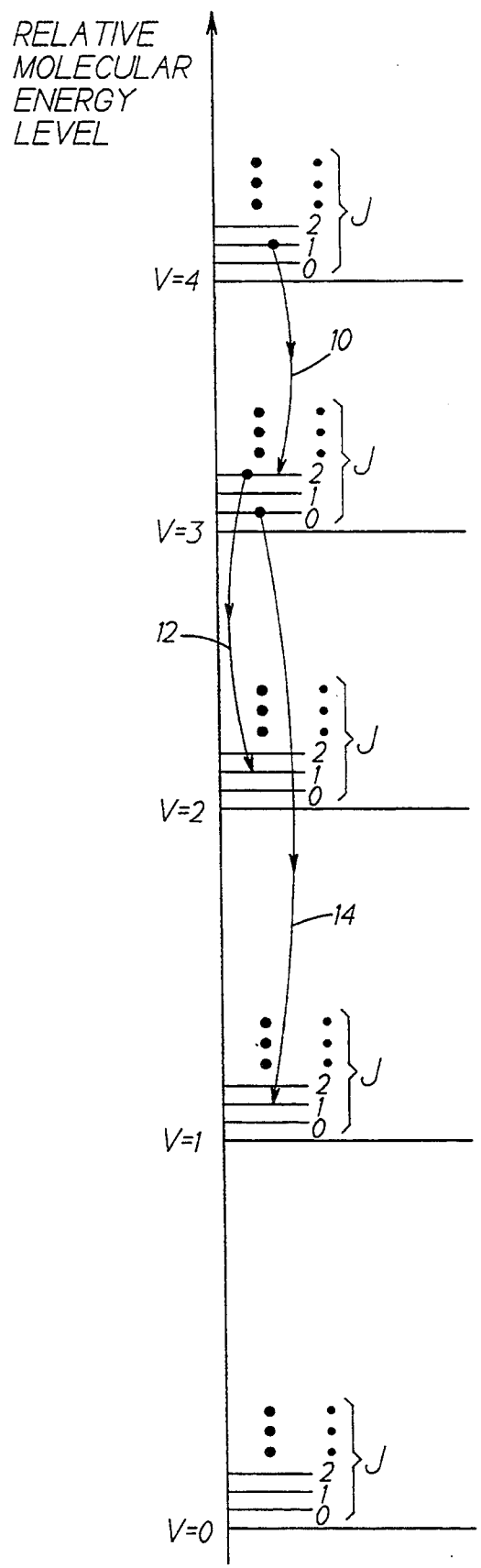
FIG. 2 is a diagram of the relative molecular energy levels in a molecular gas medium and types of lasing transitions, in accordance with the present invention.

Referring now to FIG. 2, in order to produce an "excited" gain medium needed for lasing to occur in a molecular gain medium, the molecules within the gain medium must be excited (pumped) to a known vibrational and rotational energy level. The vibrational energy level is typically indicated by a V quantum number, and the rotational energy level is typically indicated by a J quantum number. Each vibrational or V energy level has a plurality of closely spaced rotational or J energy sub-levels associated therewith. In general, as the number increases, the level of energy (or the level of excitement) of the molecules increases.

As is known, once a molecule is excited to a given energy level (or excited state), and it transitions to lower energy level, a photon (or light packet) is emitted having a wavelength related to the energy difference between the two levels. More specifically, when a molecule undergoes an optical transition between a higher V-level and lower V-level, a photon is emitted having a known optical frequency ($\nu$) defined by the equation: $\nu = \Delta E/h$, where $\Delta E$ is the energy difference between the two levels concerned, and h is Plancks constant. The wavelength $\lambda$ of the emitted light is related to the optical frequency $\nu$ of the light emitted by the equation: $\lambda = c/n\nu$, where c is the speed of light and n is the index of refraction of the medium.

As is known, an emission process may occur in two distinct ways. Spontaneous emission, in which the molecule drops to a lower level in an entirely random way, and stimulated emission in which the molecule is "triggered" to undergo the transition by the presence of photons of a wavelength equal to that of the transition. The stimulated emission process, as is known, results in coherent radiation because the waves associated with the stimulating and stimulated photons have the same frequencies, are in phase, and have the same polarization. Thus, with stimulated emission, the amplitude of an incident wave can grow as it passes through a collection of atoms producing the commonly known laser action. To produce laser action, as is known, the total number of excited molecules per cubic-centimeter (cc) must be greater than a known predetermined level for a given material, creating what is known as "population inversion".

There are typically two types of lasing transitions which can occur with molecular gas lasing mediums, P-branch transitions and R-branch transitions. For a P-branch vibrational-rotational transition, the J-level increases, while for an R-branch vibrational-rotational transition, the J-level decreases. In both cases the V-level decreases by at least one level.

When the V-level changes by only one number, the transition is called a "fundamental" lasing transition. For example, in FIG. 1, a P-branch fundamental transition from $v=4$, $J=1$ to $v=3$, $J=2$ is indicated by a line 10. Also, if a molecule with an energy level $v=3$, $J=2$ transitions to a level of $v=2$, $J=1$, as indicated by a line 12, this is an R-branch fundamental lasing transition.

If the V-level changes by 2 or more, the transition is called a "overtone" transition. Thus, in FIG. 1, a transition from $v=3$, $J=0$ to $v=1$, $J=1$ is a P-branch overtone transition, as indicated by a line 14. As is known, the wavelengths of the photons emitted for each of the aforementioned transitions 10,12,14 are different from each other, and are determined by the given gain medium.

As discussed in the copending U.S. patent application Ser. No. 980,016, a molecular gas may be pumped by a semiconductor diode provided the pumping light has a pumping wavelength that is within the absorption frequency band of the pumped gas; has a wavelength capable of pumping said gas molecules from the ground state to an excited state; is injected relatively uniformly to provide a substantially homogeneous excited medium; and the pathlength of the pumping light is sufficient to allow absorption of the pumping light by the gas.

Figure 3:
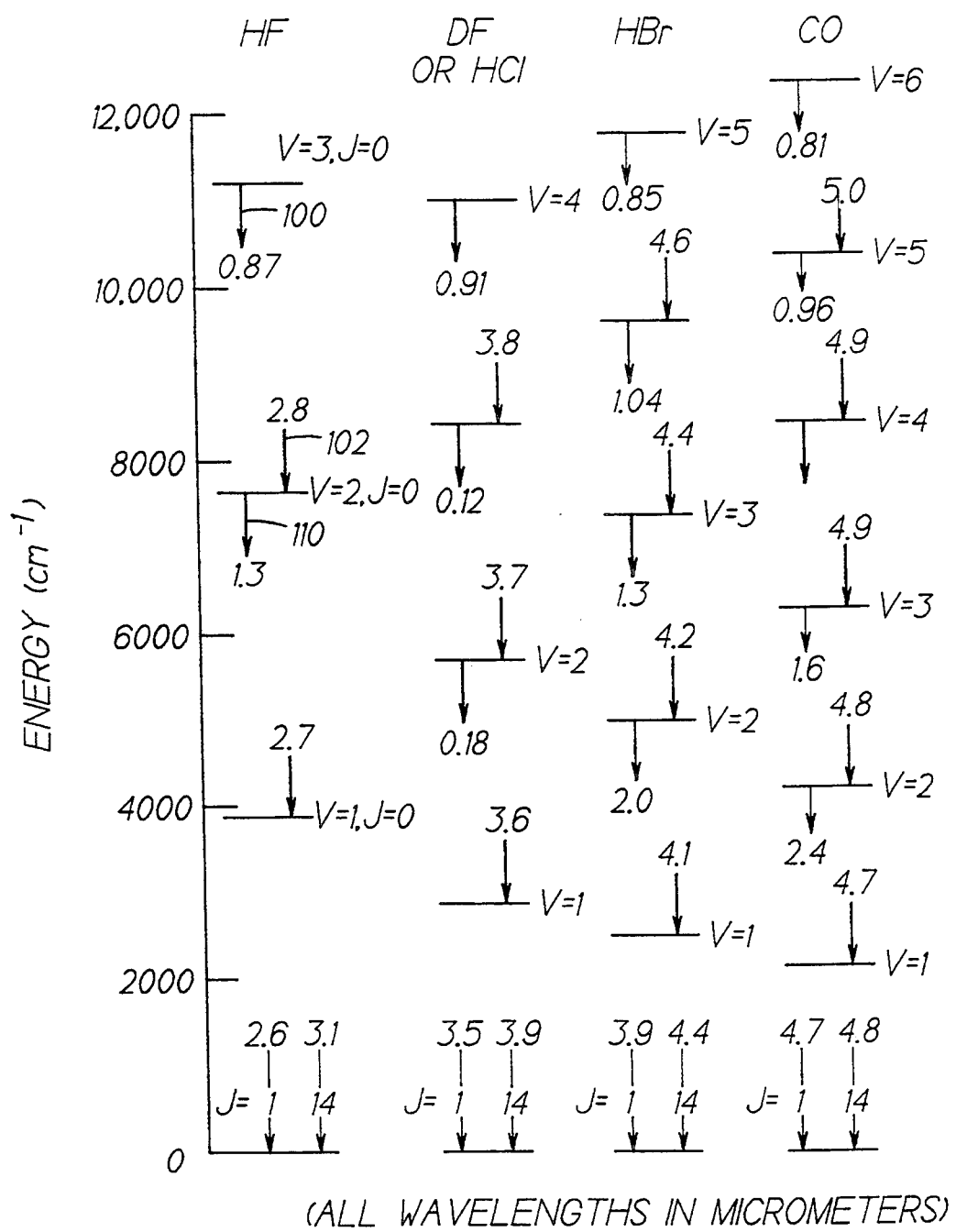
FIG. 3 is a diagram showing the molecular energy levels and lasing transitions for specific gases, in accordance with the present invention.

Referring now to FIG. 3, for efficient diode optical pumping of the first gas, the first gas should have energy levels near that of the laser diode. Some possible gas media are illustrated in FIG. 3 which shows the molecular energy level spacings in the corresponding lasing wavelengths and pump wavelengths, as also discussed in the aforementioned patent application.

For example, for HF gas, the HF molecules may be pumped to the $v=3$, $J=0$ level with a diode pumping wavelength of approximately 0.87 microns which is a typical value for currently available laser diodes. Similarly, a wavelength of approximately 0.91 microns will excite DF or HCl molecules into the $v=4$ state. Also, a wavelength of 0.85 microns will excite HBr molecules into the $v=5$ state, and a wavelength of 0.81 microns will excite CO molecules into the $v=6$ state. The arrows leaving from a given energy level, such as on line 100, indicate the wavelength emitted when transitioning from that level down to $v=0$ or ground level. Similarly, arrows entering a given energy level, such as on line 102, indicates the lasing wavelength emitted when transitioning from one V-level above, e.g., a transition in HF from $v=3$ down to the $v=2$ level emits a photon having a wavelength of about 2.8 microns, as indicated by the line 102.

Figure 4A:
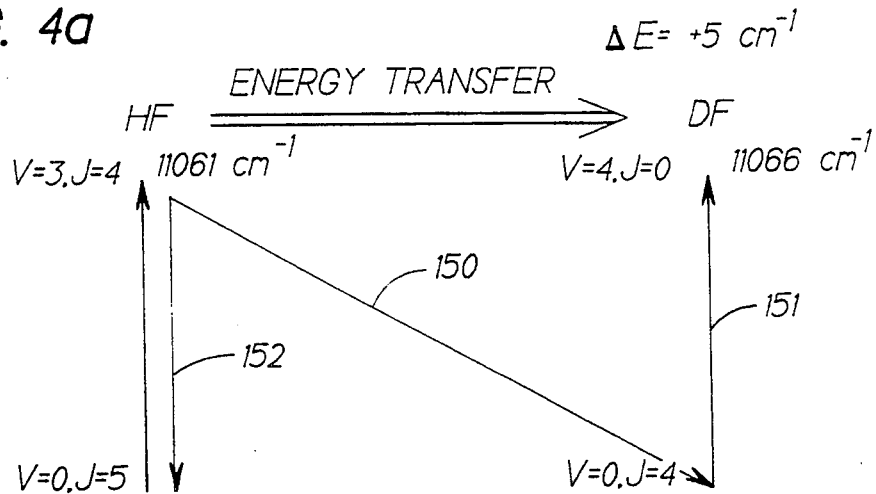
FIGS. 4a, 4b, 4c are diagrams of the energy transfer which occurs from HF gas to DF gas in a two gas system for three different starting HF energy levels, in accordance with the present invention.

Referring now to FIG. 4a, wavelengths other than those associated with the first (pumped) gas may be generated by having a second gas in the cavity 44 (FIG. 1) whereby the second gas absorbs the energy of the excited (pumped) gas molecules and then lases at wavelengths associated with the second gas (as opposed to the first gas).

The rate of energy transfer between HF (pumped gas) and the secondary gas is a function of the energy difference between the energy levels. For example, when the HF molecules are pumped to a $v=3$, $J=4$ state, the associated HF energy is approximately 11,061 $cm^{-1}$. We have found that for a DF gas medium the $v=4$, $J=0$ energy level corresponds to a DF energy of 11,066 $cm^{-1}$. Because of the small difference in energy, i.e., $\Delta E = +5$ $cm^{-1}$, the excited HF molecules can transfer their energy to the DF ground state molecules with a high probability per collision. Thus the energy from the HF molecule having a $v=3$, $J=4$ energy level is transferred to the DF molecule thereby exciting the DF from the $v=0$, $J=1$ to the $v=4$, $J=0$ level as indicated by lines 150,151. Consequently, the energy of the HF molecule drops from the $v=3$, $J=4$ level down to the $v=0$, $J=5$ level, as indicated by a line 152.

Figure 4B:
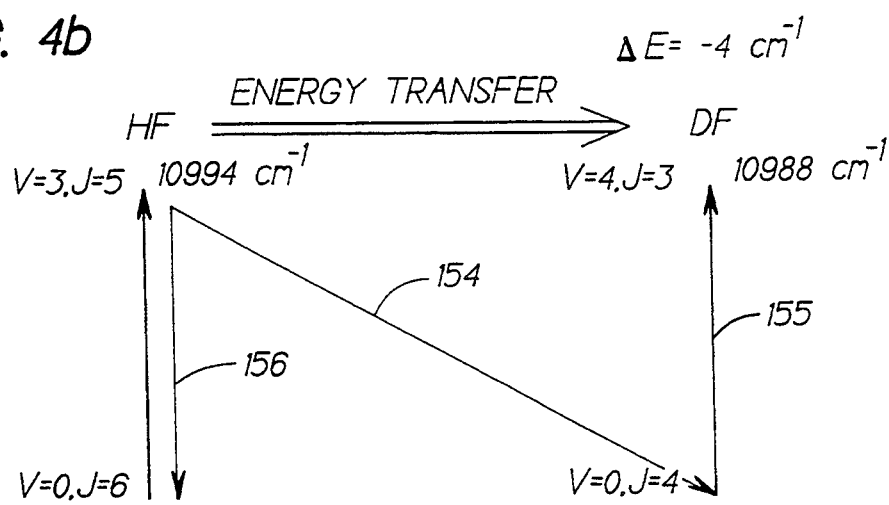

Referring to FIG. 4b similarly, when HF molecules are pumped to the $v=3$, $J=5$ energy level the associated HF energy is approximately 10,994 $cm^{-1}$. For a DF gas, the $v=4$, $J=3$ state, corresponds to a DF energy of 10,988 $cm^{-1}$. Again, because of the small difference in energy, i.e., $\Delta E = -4$ $cm^{-1}$, the energy of the excited HF molecules can easily transfer to the DF molecules thereby exciting the DF from the $v=0$, $J=4$ to the $v=4$, $J=3$ level as indicated by lines 154,155.

Consequently, the energy of the HF molecule drops from the $v=3$, $J=5$ level down to the $v=0$, $J=6$ level as indicated by a line 156.

Figure 4C:
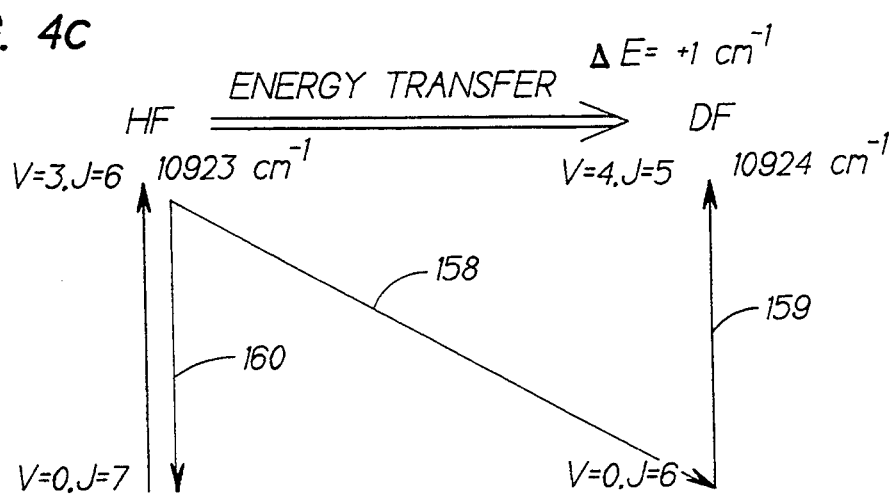

Referring to FIG. 4c, similarly, when HF molecules are pumped to the $v=3$, $J=6$ energy level, the associated HF energy is approximately 10,923 $cm^{-1}$. For a DF gas, the $v=4$, $J=5$ state, corresponds small difference in energy, i.e., $\Delta E=+1$ $cm^{-1}$, the energy of the excited HF molecules can easily transfer to the DF molecules thereby exciting the DF from the $v=0$, $J=6$ to the $v=4$, $J=5$ level as indicated by lines 158,159. Consequently, the energy of the HF molecule drops from the $v=3$, $J=6$ level down to the $v=0$, $J=7$ level as indicated by a line 160.

For the three HF-DF energy transfers shown in FIGS. 4a,4b,4c, the energy difference between the HF and DF levels is almost zero in each case. This relates to a probability for energy transfer for these particular transitions of about 0.2 per collision, i.e., 20%. For the operating conditions discussed herein, all the energy is transferred from one gas to the other in less than a microsecond.

Referring now to FIG. 5, once the DF molecules have been excited to a given level by the energy transfer from the HF molecules, lasing can now occur at a plurality of new wavelengths specifically associated with the DF molecules. For example, regarding the example in FIG. 4a, if the DF molecules are excited to the $v=4$, $J=0$ level, a P-branch fundamental DF transition from the $v=4$, $J=0$ to the $v=3$, $J=1$ level will emit a wavelength of 3.82 microns, as indicated by a line 138. Similarly, a second fundamental DF transition can occur from the $v=3$, $J=1$ level down to the $v=2$, $J=2$ level whereby a wavelength of 3.72 microns is emitted, as indicated by a line 139. Also, a third fundamental DF transition can occur from the $v=2$, $J=2$ level down to the $v=1$, $J=3$ level where a wavelength of 3.64 microns is emitted, as indicated by a line 140. Thus, a single pumping line in HF may produce three cascaded lasing transitions producing three distinct lasing wavelengths (or lines) related to DF.

Similarly, for the example in FIG. 4b, if DF is excited to the $v=4$, $J=3$ level, three cascaded fundamental transitions may occur emitting 3.91, 3.82, and 3.73 microns, respectively, as indicated by lines 141-143, respectively. Also, for the example in FIG. 4c, if DF is excited to the $v=4$, $J=5$ level, three different cascaded fundamental tranisitions may occur emitting 3.98, 3.89, and 3.80 microns, respectively, as indicated by lines 144-146, respectively. Therefore, by using a second gas, lasing wavelengths different from those of the pumped gas can achieved. It should be understood that other DF lasing tranisitions may be achieved as shown in FIG. 5.

Figure 6:
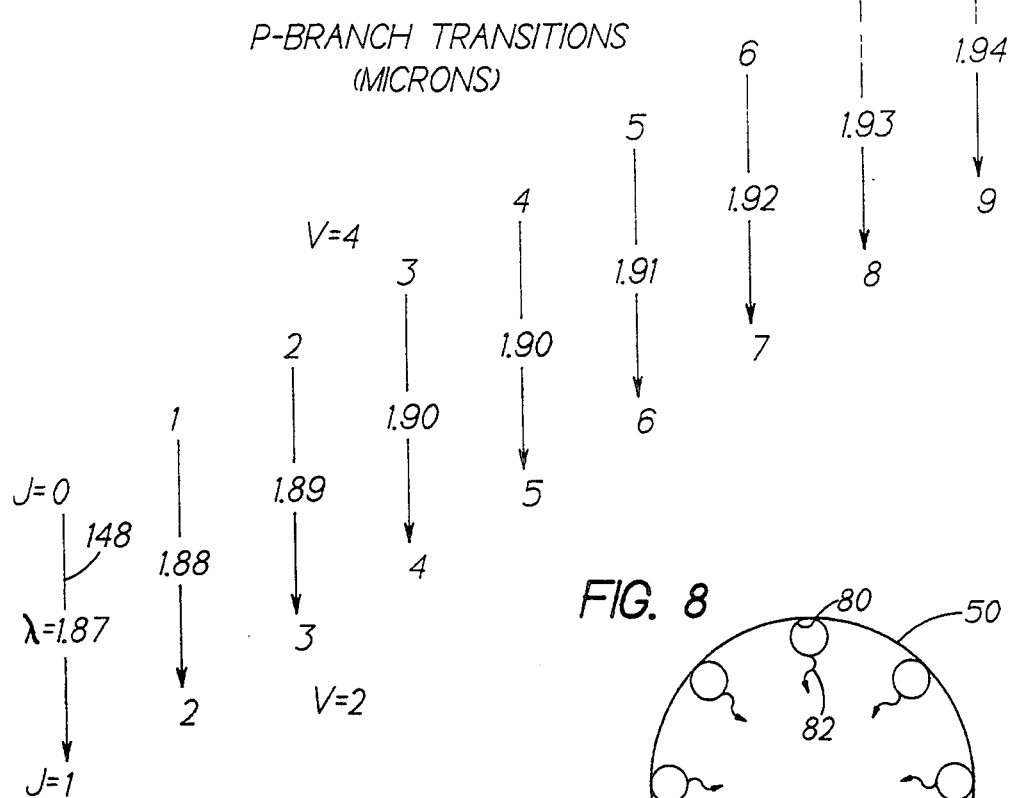
FIG. 6 is a diagram of DF P-branch overtone lasing transitions from $v=4$ to $v=2$ level and the associated lasing wavelengths, in accordance with the present invention.

Referring now to FIG. 6, DF may also produce "overtone" lasing transitions (i.e., transitions with $v=2$ or more). For example, if the DF molecules are excited to a level of $v=4$, $J=0$, and a P-branch overtone transition occurs, the lasing wavelength will be 1.87 microns, as indicated by a line 148. Other overtone lasing wavelengths may be achieved by pumping to different levels, as indicated by FIG. 6.

Therefore, using HF as the pumped gas and DF as the lasing gas produces lasing wavelengths different from that available from solely HF. More specifically, for HF fundamental P-branch tranisitions, the lasing wavelengths range from about 2.55 to 3.14, as shown in FIG. 5 of the aforementioned copending application, and for DF fundamental P-branch tranisitions, the lasing wavelengths range from about 3.58 to 4.06, as shown in FIG. 5 herein. Also, for HF overtone P-branch tranisitions, the lasing wavelengths range from about 1.36 to 1.47, as shown in FIG. 6 of the aforementioned copending application, and for DF overtone P-branch tranisitions, the lasing wavelengths range from about 1.87 to 1.94 microns, as shown in FIG. 6 herein.

Thus, the invention allows selection of the first (pumped) gas to be based on matching to the laser diode characteristics and selection of the second (lasing) gas to be done based on the desired lasing wavelength. Thus, if the pumped gas has excellent absorption characteristics at the laser diode wavelength but does not provide the desired output wavelength, the second gas may be selected to provide the desired output wavelength, provided the energy levels between the first and second gases match-up.

Instead of using DF for the second gas, other molecular gases having energy levels near that of the pumped gas (HF) may be used, e.g., HF, DF, HBR, HCL, CO, NO, and $CO_2$. Also, if a pumped gas other than HF is used, the second gas must similarly have energy levels near the pumped gas.

Also, the present invention may perform a 3-gas energy transfer system to excite a third gas, such as $CO_2$. It is known in the art to transfer energy from HF to $CO_2$ and DF to $CO_2$, and it is also known that DF energy levels match-up better with $CO_2$ than does HF, as described in the article: T. Cool et al, "37 DF-$CO_2$ and HF-$CO_2$ Continuous-Wave Chemical Lasers", Appl. Phys. Let., Vol. 15, No. 10 p318 (Nov. 1969). In that case, if HF has the best absorption characteristics and DF has the best transfer characteristics to $CO_2$, the system could be HF-DF-$CO_2$. This allows the $CO_2$ to be excited in a more efficient fashion than that currently used in the art.

The efficiencies discussed in the aforementioned copending patent application, i.e., quantum efficiency $\eta 1$, lasing efficiency $\eta 2$, energy absorption (i.e., absorption coefficient - length product) $\eta 3$, gas relaxation effects $\eta 4$, and laser diode efficiency $\eta 5$, are basically the same with a multi-gas system. However, the absorption coefficient is only related to the first (pumped) gas, not the second (lasing) gas that has energy transferred to it.

For the invention described herein, the quantum efficiency is about 80%, the lasing efficiency is 60%, the absorbed diode energy is about 60%, the gas relaxation effects are negligible, and the diode laser efficiency is about 35%. Given these values a minimum predicted wall-plug efficiency, i.e., input drive current to output optical power, at least 10% and a light conversion efficiency of at least 29% (photons in to photons out), as discussed in the aforementioned patent application.

Also, the absorption bandwidth may be "pressure broadened" by increasing the pressure of the pumped (first) gas due to collisions of the molecules, by adding a higher pressure inert gas such as Argon, as discussed in the aforementioned patent application. Also, any other inert gas may be used if desired, such as Helium (He). Also, the addition of higher pressure Ar increases the rate of J-level redistribution at the ground state to an equilibrium condition after lasing occurs. This broader linewidth allows for easier tuning of the semiconductor laser output to the center of the absorption band of the first gas, as discussed in the aforementioned copending patent application.

Tuning of the laser diode center frequency is performed by varying the temperature of the laser diode with the thermo-electric (TE) coolers 31 (FIG. 1), e.g., thermocouples used in the reverse direction. However, other techniques may be used to tune the laser diode center frequency if desired, as discussed hereinafter.

The invention may be used with either steady state pumping, i.e., continuous wave (cw), or pulsed pumping, as discussed in the aforementioned copending patent application.

In FIG. 1, instead of using the fibers 26 to inject light into the optical elements 34,38, the output light from the diodes may be directly incident on the element 34 without the use of the fibers 26. Also, instead of using lenses 34,38 any optical element capable of collecting beams from a plurality of sources and focussing them as a single beam within the cavity 44 may be used. Further, instead of using laser diodes 20, any semiconductor laser may be used, provided the gas used has adequate absorption in the output wavelength band of the semiconductor laser.

For adjusting the temperature of the laser diodes 20 (FIG. 1), it is known that diodes fabricated from the center of a semiconductor wafer tend to operate at a single common frequency. Consequently, to economize on the number of TE coolers 28, a group of diodes made from the center of a wafer may be temperature controlled together using a single TE cooler. However, those made from the edges of the wafer, may need to be controlled separately.

In addition to or instead of temperature tuning the laser diodes, the laser diode wavelength and linewidth may also be controlled with an external grating. We have found that a laser diode with an external grating can be discretely tuned over its gain profile while the diode was held at a constant temperature. In that case, the laser diode linewidth is less than 300 Khz, as also discussed in the aforementioned patent application.

Figure 8:
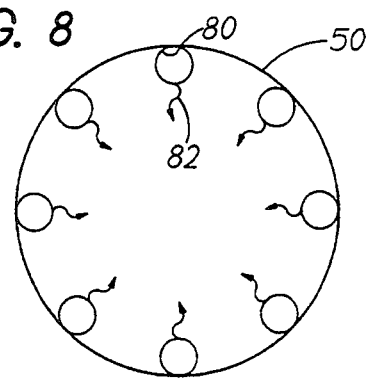
FIG. 8 is a diagram of a cross-section of the lasing tube showing the optical fibers located around the inside radius of the laser tube, in an alternative embodiment, in accordance with the present invention.
Figure 7:
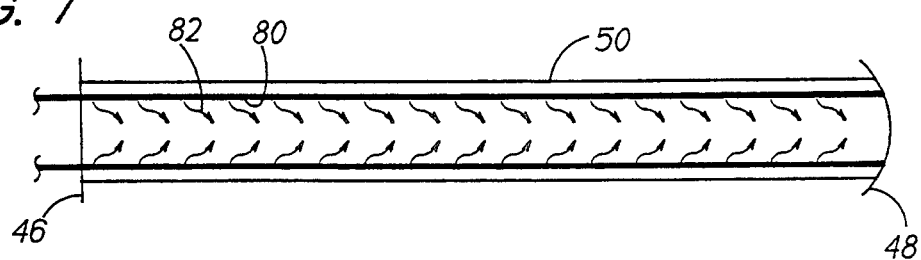
FIG. 7 is a diagram showing optical fibers inside the laser cavity used to excite the gas medium, in an alternative embodiment, in accordance with the present invention.

Referring to FIGS. 7 and 8, alternative embodiments may be used, such as stringing fibers 80 from the laser diodes 20 (not shown, see FIG. 1) along the inside perimeter of the laser tube 50. In that case, evanescent light fields 82 emitted from the side walls of the fibers 80 provide the photons to excite the gas. To optimize the emission of the evanescent field the fibers are selected to have similar, i.e., almost equal, refractive indices for the cladding and the core of the fibers, as is known.

Figure 9:
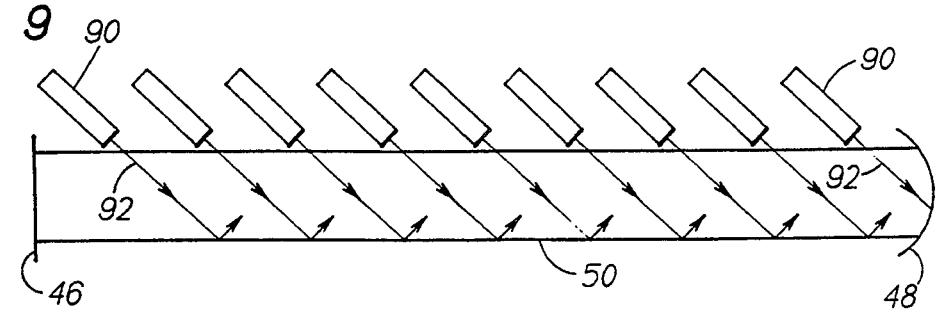
FIG. 9 is a diagram of a plurality of laser diodes including pumping radiation into the sides of a laser tube, in an alternative embodiment, in accordance with the present invention.

Referring to FIG. 9, alternatively, if the diameter of the tube 50 is large enough, a plurality of laser diodes 90 may be disposed physically on the perimeter of the laser tube 50 and inject light 92 at an angle to the tube 50 through small holes in the laser tube 50 at different locations along the laser tube 50. Other embodiments may also be utilized to pump the gas using a solid state laser.

In FIG. 1, instead of using the fibers 26 to inject light into the optical elements 34,38, the output light from the diodes may be directly incident on the element 34 without the use of the fibers 26. Also, instead of using lenses 34,38 any optical element capable of collecting beams from a plurality of sources and focussing them as a single beam within the cavity 44 may be used. Further, instead of using laser diodes 20, any semiconductor laser may be used, provided the gas used has adequate absorption in the output wavelength band of the semiconductor laser.

Still further, the optical pumping may be either continuous wave (cw) or pulsed, as discussed in the aforementioned copending patent application.

It should be understood by those skilled in the art that the invention may be used to obtain an excited molecular gas medium that may be used for many different applications, e.g., an amplifier, a resonator (laser), or any device that requires an excited medium to operate. Furthermore, any device that needs a small number of lasing wavelengths, or selective control of the output lasing wavelengths may employ the invention to achieve this objective.

Also, it should be understood that the invention will work equally well with the second gas being any molecular gas provided the energy difference between the pumped (first) gas and the second gas (that energy is transferred to) is relatively small, e.g., $\Delta E = 0$–$20$ cm$^{-1}$ at the energy level of interest.

It should be understood that the laser diodes (FIG. 1) need not be phase locked (coherently coupled) to each other; however they must be operating at the same frequency. Consequently, the invention provides a gas laser that can be easily scaled to any power level by adding the desired number of pumping laser diodes.

Although the invention has been described and illustrated with respect to the exemplary embodiments thereof, it should be understood by those skilled in the art that the foregoing and various other changes, omissions and additions may be made without departing from the spirit and scope of the invention.

I claim:

1. A semiconductor laser pumped multiple molecular gas laser, comprising:

a plurality of semiconductor lasers each emitting pumping light having a pumping wavelength;

a first molecular gas having an absorption frequency band;

a second molecular gas having predetermined lasing wavelengths;

said pumping wavelength of said semiconductor lasers being within said absorption frequency band of said first gas and being capable of pumping said first gas molecules from the ground state to an excited state;

gas laser cavity means, disposed in the path of said pumping light from said plurality of semiconductor lasers, for housing said first and said second molecular gases, for allowing said pumping wavelength into said cavity, and for providing an output laser light having a lasing wavelength corresponding to said second gas;

said pumping light being injected relatively uniformly into said gas lasing cavity means to provide a substantially homogeneous excited medium and the pathlength of said pumping light being sufficient to allow absorption of said pumping light by said first gas;

said first gas being pumped to a first energy level close in value to a second energy level of said second gas; and whereby said first energy level of said first gas transfers to said second energy level of said second gas, thereby exciting said second gas to allow lasing thereof.

2. The gas laser of claim 1 wherein said gas laser cavity means comprises:

a waveguide tube for housing said first gas and said second gas, being reflective at said pumping wavelength and said lasing wavelength;

a first mirror disposed at a first end of said tube, being transmissive at said pumping wavelength and being reflective at said lasing wavelengths; and a second mirror disposed at a second end of said tube, opposite said first end, being reflective at said pumping wavelength and being transmissive at said lasing wavelengths.

3. The gas laser of claim 2 wherein said waveguide tube comprises a glass tube coated with a highly reflective coating.

4. The gas laser of claim 3 wherein said waveguide tube acts as a heat sink.

5. The gas laser of claim 1 further comprising an optical fiber associated with each of said plurality of semiconductor lasers for propagating said pumping light from said semiconductor lasers to said gas laser cavity means.

6. The gas laser of claim 5 wherein said optical fiber associated with each of said plurality of semiconductor lasers emits an evanescent field from the sides of said fiber to excite said first gas.

7. The gas laser of claim 1 further comprising optical means for converting divergent light emitted from said semiconductor lasers to focussed light incident on said first gas within said gas laser cavity means.

8. The gas laser of claim 1 further comprising frequency control means for controlling said pumping wavelength of said pumping light to near the center of said absorption band.

9. The gas laser of claim 8 wherein said frequency control means comprises thermoelectric coolers disposed on said semiconductor lasers.

10. The gas laser of claim 1 wherein said first and said second molecular gases are hydrogen halide gases.

11. The gas laser of claim 1 wherein said first molecular gas is selected from the group consisting of HF, DF, HCl, HBr, and CO, and said second molecular gas is selected from the group consisting of HF, DF, HCl, HBr, CO, and $CO_2$.

12. The gas laser of claim 1 further comprising an inert gas having a higher partial pressure than said first gas, to pressure-broaden said absorption frequency band.

13. The gas laser of claim 12 wherein said inert gas comprises Argon.

14. The gas laser of claim 1 wherein said pumping light is continuous wave.

15. The gas laser of claim 1 wherein said pumping light is pulsed at a predetermined pulse length.

16. An apparatus for providing an excited multiple molecular gas medium, comprising:

a plurality of semiconductor lasers each emitting pumping light having a pumping wavelength;

a first molecular gas having an absorption frequency band;

a second molecular gas having predetermined lasing wavelengths;

said pumping wavelength of said semiconductor lasers being within said absorption frequency band of said first gas and being capable of pumping said first gas molecules from the ground state to an excited state;

gas containment means, disposed in the path of said pumping light from said plurality of semiconductor lasers, for housing said first and said second molecular gases and for allowing said pumping wavelength into said cavity; and said pumping light being injected relatively uniformly into said gas lasing cavity means to provide a substantially homogeneous excited medium and the pathlength of said pumping light being sufficient to allow absorption of said pumping light by said first gas.

17. The apparatus of claim 16 further comprising an optical fiber associated with each of said plurality of semiconductor lasers for propagating said pumping light from said semiconductor lasers to said gas containment means.

18. The apparatus of claim 16 further comprising optical means for converting divergent light emitted from said semiconductor lasers to focussed light incident on said gas within said gas laser cavity means.

19. The apparatus of claim 16 further comprising wavelength control means for controlling said pumping wavelength of said pumping light to near the center of said absorption band.

20. The apparatus of claim 16 wherein said wavelength control means comprises thermoelectric coolers disposed on said semiconductor lasers.

21. The apparatus of claim 16 wherein said first and said second molecular gases are hydrogen halide gases.

22. The gas laser of claim 16 wherein said first molecular gas is selected from the group consisting of HF, DF, HCl, HBr, and CO, and said second molecular gas is selected from the group consisting of HF, DF, HCl, HBr, CO, and $CO_2$.

* * * * *